United States Patent
Lai et al.

(10) Patent No.: US 9,257,505 B2
(45) Date of Patent: Feb. 9, 2016

(54) STRUCTURES AND FORMATION METHODS OF FINFET DEVICE

(71) Applicant: Taiwan Semiconductor Manufacturing Co., Ltd, Hsin-Chu (TW)

(72) Inventors: Ying-Hua Lai, Taipei (TW); Chia-Ming Chang, Hsinchu (TW); Tsung-Yu Chiang, New Taipei (TW); Kuang-Hsin Chen, Jung-Li (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 0 days.

(21) Appl. No.: 14/273,970

(22) Filed: May 9, 2014

(65) Prior Publication Data

US 2015/0325646 A1    Nov. 12, 2015

(51) Int. Cl.
| | |
|---|---|
| H01L 21/76 | (2006.01) |
| H01L 29/06 | (2006.01) |
| H01L 29/78 | (2006.01) |
| H01L 29/16 | (2006.01) |
| H01L 29/161 | (2006.01) |
| H01L 29/66 | (2006.01) |
| H01L 21/762 | (2006.01) |
| H01L 21/28 | (2006.01) |
| H01L 21/02 | (2006.01) |
| H01L 21/311 | (2006.01) |
| H01L 27/092 | (2006.01) |
| H01L 21/8238 | (2006.01) |
| H01L 29/165 | (2006.01) |
| H01L 29/24 | (2006.01) |

(52) U.S. Cl.
CPC ...... *H01L 29/0653* (2013.01); *H01L 21/02521* (2013.01); *H01L 21/02529* (2013.01); *H01L 21/02532* (2013.01); *H01L 21/28255* (2013.01); *H01L 21/31105* (2013.01); *H01L 21/762* (2013.01); *H01L 21/823807* (2013.01); *H01L 21/823821* (2013.01); *H01L 21/823878* (2013.01); *H01L 27/0922* (2013.01); *H01L 27/0924* (2013.01); *H01L 29/161* (2013.01); *H01L 29/165* (2013.01); *H01L 29/1608* (2013.01); *H01L 29/24* (2013.01); *H01L 29/6681* (2013.01); *H01L 29/7842* (2013.01); *H01L 29/7851* (2013.01)

(58) Field of Classification Search
CPC .............................. H01L 29/74; H01L 31/111
USPC ................... 257/369, 407; 438/164, 300, 424
See application file for complete search history.

(56) References Cited

U.S. PATENT DOCUMENTS

| | | | |
|---|---|---|---|
| 2008/0038899 A1* | 2/2008 | Ahn ............................. | 438/430 |
| 2011/0195555 A1* | 8/2011 | Tsai et al. ................... | 438/301 |
| 2013/0193446 A1 | 8/2013 | Chao et al. | |
| 2014/0273429 A1* | 9/2014 | Wei et al. .................... | 438/595 |
| 2015/0041913 A1* | 2/2015 | An et al. ...................... | 257/369 |
| 2015/0076561 A1* | 3/2015 | Cheng et al. ................ | 257/192 |

* cited by examiner

*Primary Examiner* — Phuc Dang
(74) *Attorney, Agent, or Firm* — Birch, Stewart, Kolasch & Birch, LLP

(57) ABSTRACT

A semiconductor device includes a semiconductor substrate and an isolation structure over the semiconductor substrate. The semiconductor device also includes a first epitaxial fin and a second epitaxial fin over the semiconductor substrate, and the first epitaxial fin and the second epitaxial fin protrude from the isolation structure. The semiconductor device further includes a gate stack over and traversing the first epitaxial fin and the second epitaxial fin. In addition, the semiconductor device includes a recess extending from a top surface of the isolation structure. The recess is between the first epitaxial fin and the second epitaxial fin.

20 Claims, 11 Drawing Sheets

STRUCTURES AND FORMATION METHODS OF FINFET DEVICE

BACKGROUND

Semiconductor devices are used in a variety of electronic applications, such as personal computers, cell phones, digital cameras, and other electronic equipment. The semiconductor devices are fabricated by sequentially depositing insulating or dielectric layers, conductive layers, and semiconductor layers over a semiconductor substrate, and patterning the various material layers using lithography and etching processes to form circuit components and elements on the semiconductor substrate.

As the semiconductor industry has progressed into nanometer technology process nodes in pursuit of higher device density, higher performance, and lower costs, challenges from both fabrication and design issues have resulted in the development of three-dimensional designs, such as fin-like field effect transistors (FinFETs). The FinFET is fabricated with a thin vertical "fin" (or fin structure) extending from a substrate. The channel of the FinFET is formed in this vertical fin. A gate is provided over the fin. Advantages of the FinFET may include reducing the short channel effect and higher current flow.

However, since the feature sizes continue to decrease, fabrication processes continue to become more difficult to perform. Therefore, it is a challenge to form a reliable semiconductor device including the FinFET.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
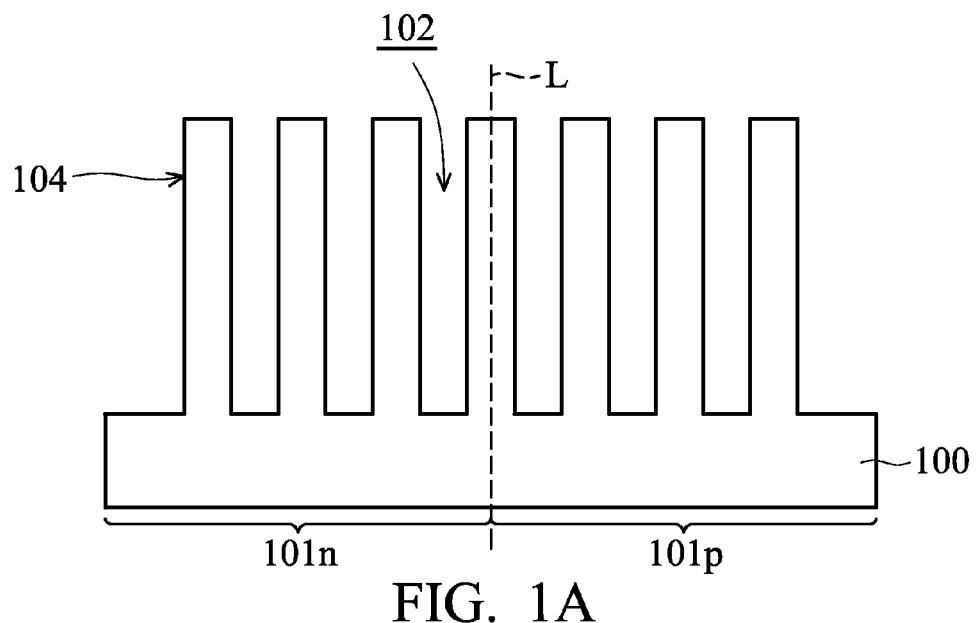
FIGS. 1A-1L are cross-sectional views of various stages of a process for forming a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1A-1L are cross-sectional views of various stages of a process for forming a semiconductor device, in accordance with some embodiments. In some embodiments, the semiconductor device is a fin-like field effect transistor (FinFET) device. As shown in FIG. 1A, a semiconductor substrate 100 is provided. In some embodiments, the semiconductor substrate 100 is a bulk semiconductor substrate, such as a silicon wafer. In some other embodiments, the semiconductor substrate 100 includes other elementary semiconductors such as germanium, or it includes a compound semiconductor. The compound semiconductor may include silicon carbide, gallium arsenide, indium arsenide, indium phosphide, other suitable compound semiconductors, or a combination thereof. In some embodiments, the semiconductor substrate 100 includes a semiconductor-on-insulator (SOI) substrate. The SOI substrate may be fabricated using a separation by implantation of oxygen (SIMOX) process, wafer bonding process, other suitable methods, or a combination thereof.

As shown in FIG. 1A, the FinFET device also includes multiple fins 104 that extend from the semiconductor substrate 100, in accordance with some embodiments. In some embodiments, the fins 104 include silicon fins, germanium fins, other suitable semiconductor fins, or a combination thereof. In some embodiments, the fins 104 are formed by etching into the semiconductor substrate 100. As shown in FIG. 1A, recesses (or trenches) 102 are formed in the semiconductor substrate 100 by using a photolithography process and an etching process. As a result, the fins 104 are formed between the recesses 102. In some embodiments, the recesses 102 are strips (viewed from in the top of the FinFET device) parallel to each other and spaced with respect to each other.

As shown in FIG. 1A, the semiconductor substrate 100 includes a first region 101n and a second region 101p. A boundary L is between the first and the second regions 101n and 101p. In some embodiments, the first region 101n is used for forming an n-type FinFET device, and the second region 101p is used for forming a p-type FinFET device.

Figure 1B:
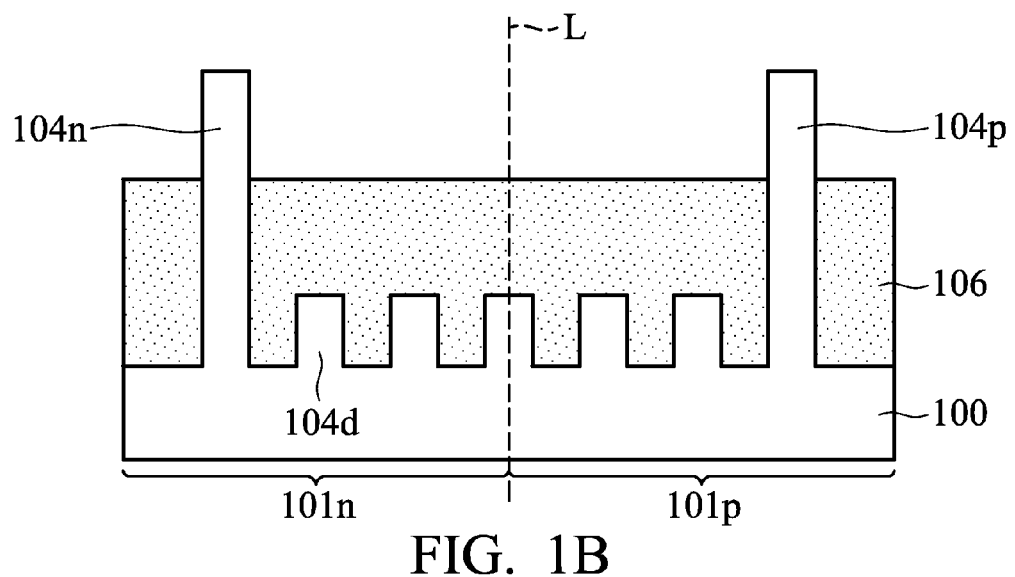

As shown in FIG. 1B, some of the fins are recessed to form dummy fins 104d, in accordance with some embodiments. In some embodiments, the fins are recessed by using an etching process. In some embodiments, the fins 104n and 104p, which are not recessed, serve as channel fins of an NMOS device and a PMOS device, respectively. In some embodiments, the fins between the fins 104n and 104p are recessed to be the dummy fins 104d to prevent short circuiting between the fins 104n and 104p in subsequent processes.

As shown in FIG. 1B, an isolation structure 106 is formed over the semiconductor substrate 100, in accordance with some embodiments. The isolation structure 106 surrounds lower portions of the fins 104n and 104p. Upper portions of the fins 104n and 104p protrude from the top surface of the isolation structure 106. In some embodiments, the isolation structure 106 is made of a dielectric material. The dielectric material may include silicon oxide, silicon nitride, silicon oxynitride, fluoride-doped silicate glass (FSG), low-K dielectric material, other suitable materials, or a combination thereof.

In some embodiments, a dielectric material layer is deposited over the semiconductor substrate 100. The dielectric material layer covers the fins 104n and 104p and the dummy fins 104d. In some embodiments, the dielectric material layer is deposited using a chemical vapor deposition (CVD) process, a spin-on process, other applicable processes, or a combination thereof. In some embodiments, a planarization process, such as a chemical mechanical polishing (CMP) process, is performed to thin down the dielectric material layer until the fins 104n and 104p are exposed. Afterwards, an etching process is performed to remove a portion of the dielectric material layer such that the fins 104n and 104p protrude from the remaining dielectric material layer. As a result, the isolation structure 106 is formed.

Figure 2A:
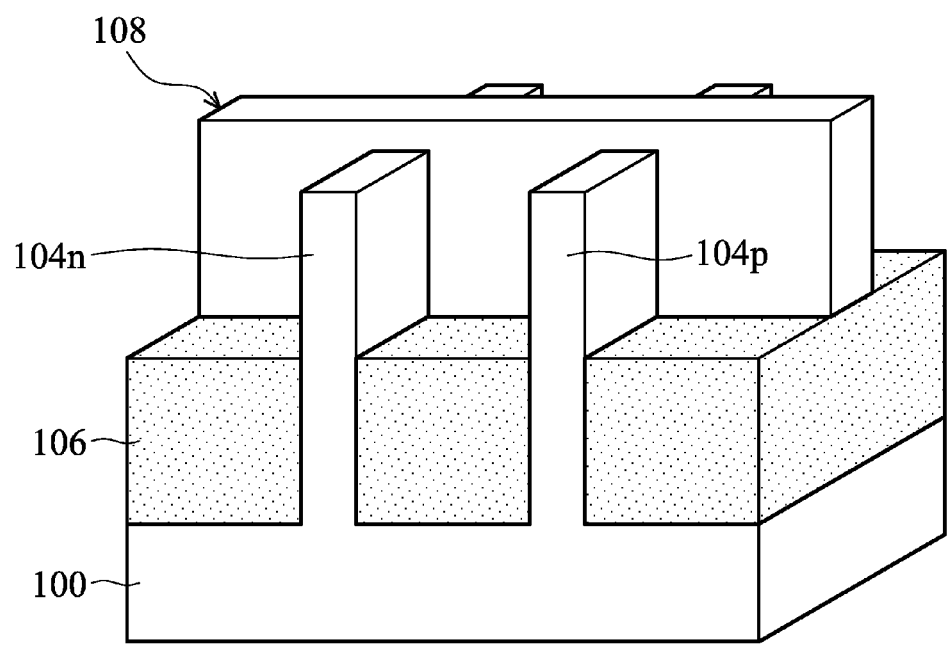
FIG. 2A is a perspective view of a semiconductor device, in accordance with some embodiments.
Figure 2B:
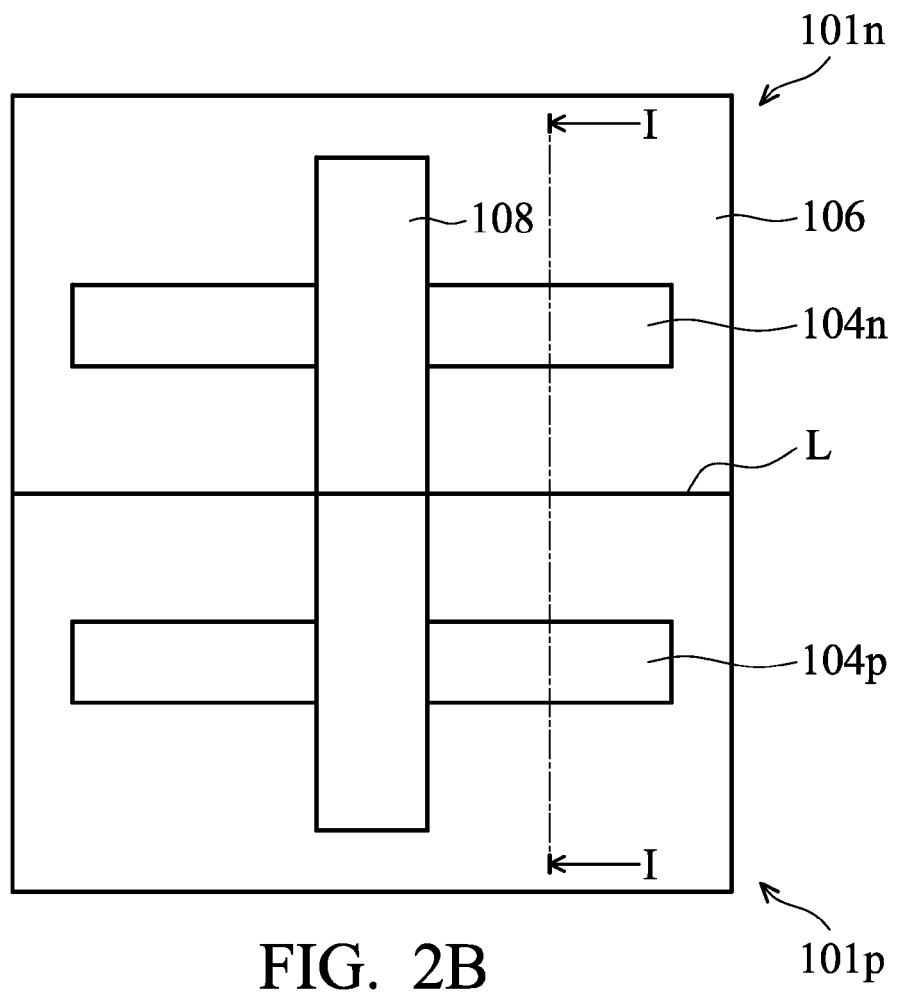
FIG. 2B is a top view of a semiconductor device, in accordance with some embodiments.

Afterwards, a gate structure is formed over the semiconductor substrate 100. FIG. 2A is a perspective view of a semiconductor device after the gate structure is formed over the structure shown in FIG. 1B, in accordance with some embodiments. FIG. 2B is a top view of a semiconductor device, in accordance with some embodiments. FIG. 1B is a cross-sectional view taken from the line I-I of FIG. 2B, in accordance with some embodiments. As shown in FIGS. 2A and 2B, a gate stack 108 is formed over the fins 104n and 104p. In some embodiments, the gate stack 108 traverses and wraps around the fins 104n and 104p. As shown in FIG. 2B, the gate stack 108 extends over the first region 101n and the second region 101p.

The gate stack 108 includes a gate dielectric layer (not shown) and a gate electrode (not shown) over the gate dielectric layer. In some embodiments, the gate dielectric layer is made of silicon oxide, silicon nitride, silicon oxynitride, dielectric material with high dielectric constant (high-K), other suitable dielectric materials, or a combination thereof. Examples of high-K dielectric materials include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, the like, or a combination thereof. In some embodiments, the gate electrode includes polysilicon or a metal material, such as TiN, TaN.NiSi, CoSi, Mo, Cu, W, Al, Co, Zr, Pt, other suitable materials, or a combination thereof. In some embodiments, a gate dielectric material layer and a gate electrode layer are sequentially deposited over the isolation structure 106 and the fins 104n and 104p. Afterwards, the gate dielectric material layer and the gate electrode layer are patterned to form the gate stack 108.

In some embodiments, a hard mask layer (not shown in FIG. 2A) is deposited and patterned over the gate electrode layer. The hard mask layer is used for assistance in the formation of the gate stack 108. In some embodiments, the hard mask layer is made of silicon nitride, other suitable materials, or a combination thereof.

Figure 1C:
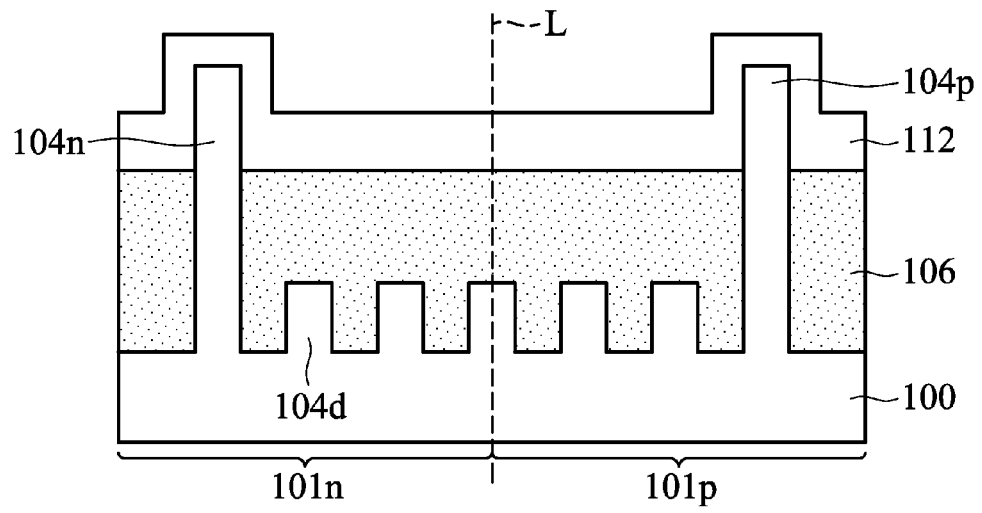

As shown in FIGS. 1C and 2A, a mask layer 112 is deposited over the fins 104n and 104p, the isolation structure 106, and the gate stack 108, in accordance with some embodiments. In some embodiments, the mask layer 112 is made of silicon nitride, silicon oxynitride, other suitable materials, or a combination thereof. In some embodiments, the mask layer 112 is deposited using a CVD process, a spin-on process, a spraying process, other applicable processes, or a combination thereof.

Figure 1D:
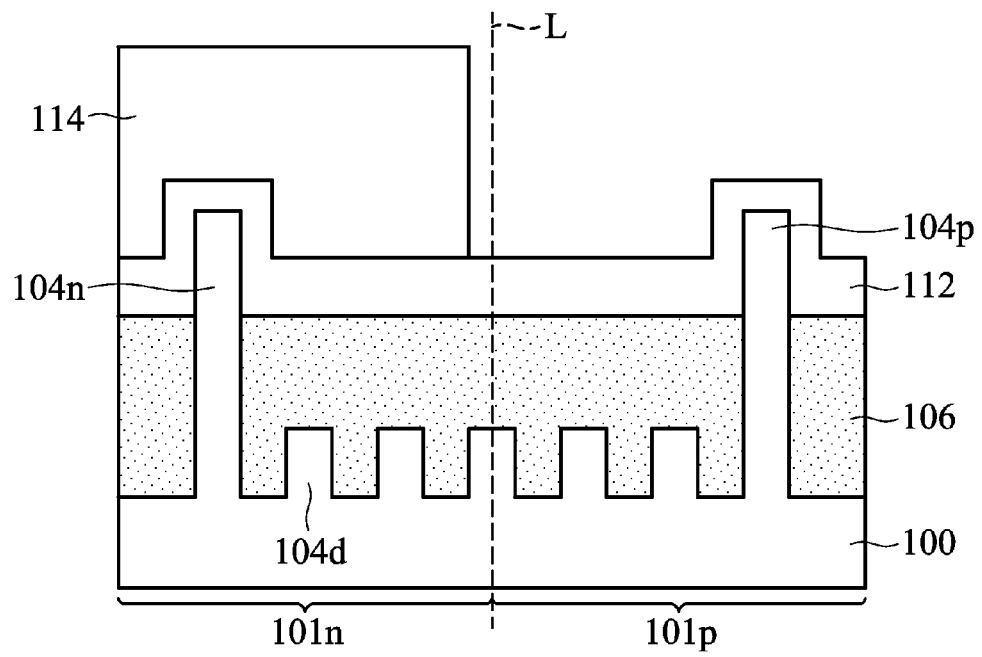

As shown in FIG. 1D, a photosensitive layer 114 is formed over the mask layer 112, in accordance with some embodiments. In some embodiments, the photosensitive layer 114 includes a photoresist layer and is formed using a photolithography process. The photolithography process may include photoresist coating (e.g., spin-on coating), soft baking, mask aligning, exposure, post-exposure baking, developing the photoresist, rinsing, drying (e.g., hard baking), other suitable processes, or a combination thereof. As shown in FIG. 1D, the photosensitive layer 114 covers most portions of the mask layer 112 over the first region 101n. However, a portion of the mask layer 112 near the boundary L between the regions 101n and 101p and over the first region 101n is exposed. The portion of the mask layer 112 over the second region 101p is also exposed without being covered by the photosensitive layer 114.

Figure 1E:
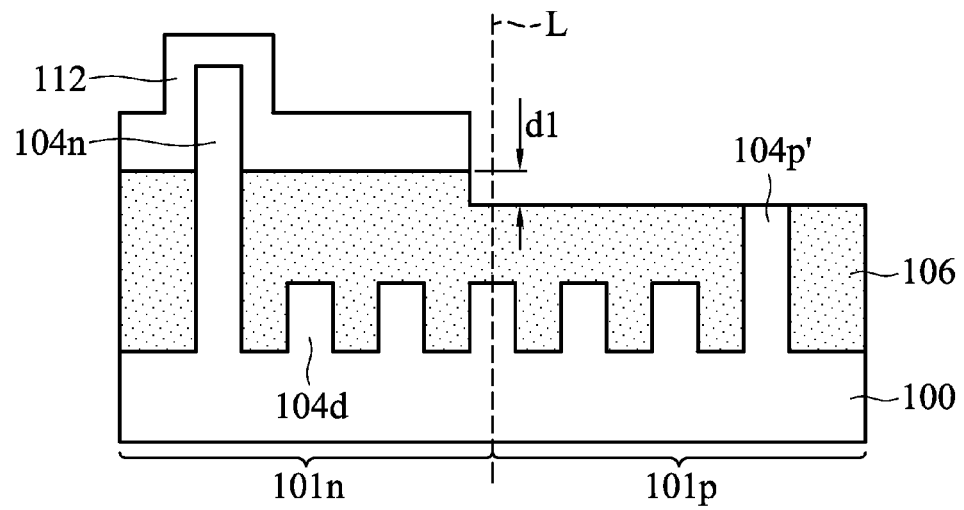

As shown in FIG. 1E, the mask layer 112 not covered by the photosensitive layer 114 is removed, in accordance with some embodiments. Therefore, the pattern of the photosensitive layer 114 is substantially transferred into the mask layer 112. In some embodiments, a portion of the isolation structure 106 is also removed during the same etching process for removal of the mask layer 112 not covered by the photosensitive layer 112. In some embodiments, the fin 104p (see FIG. 1D) is recessed to form a recessed fin 104p' by using an etching process with the mask layer 112 as an etching mask. In some embodiments, top surfaces of the recessed fin 104p' and the isolation structure 106 are substantially coplanar with each other, as shown in FIG. 1E. In some other embodiments, the top surface of the recessed fin 104p' is lower than that of the isolation structure 106. In other words, the fin 104p is etched to form the recessed fin 104p' having a top surface below the top surface of the isolation structure 106. In some embodiments, a portion of the isolation structure 106 is further removed during the etching process for recessing the fin 104p. Embodiments of the disclosure have many variations. In some other embodiments, the fin 104p is not recessed.

As mentioned above, an upper portion of the isolation structure 106 not covered by the mask layer 112 may be removed during the etching processes for removal of the mask layer 112 and recessing the fin. As shown in FIG. 1E, a step height d1 is therefore formed between the portions of the isolation structure 106 which are covered and not covered by the mask layer 112. In some embodiments, the step height d1 is in a range from about 1 nm to about 25 nm. Afterwards, the photosensitive layer 114 is removed.

Figure 1F:
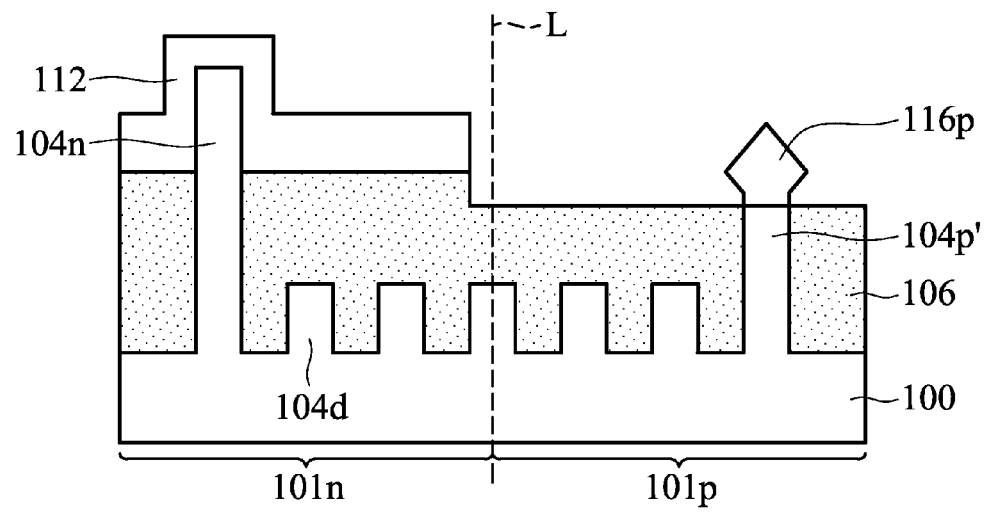

As shown in FIG. 1F, an epitaxial material is selectively grown over the recessed fin 104p' to form an epitaxial fin 116p, in accordance with some embodiments. During the growth of the epitaxial fin 116p, the mask layer 112 prevents the epitaxial material from being grown on the fin 104n. In some embodiments, the epitaxial fin 116p is a strained material such as silicon germanium (SiGe) or other suitable materials. The epitaxial fin 116p is used as strained source and drain regions. Therefore, the channel region under the gate stack 108 is strained or stressed to increase carrier mobility of the device and enhance the device performance. In some embodiments, the surface area of the epitaxial fin 116p is greater than that of the fin 104p. The resistance between the epitaxial fin 116p and a subsequently formed contact may be further reduced.

In some embodiments, the epitaxial fin 116p is epitaxially grown by using a CVD process (such as a low pressure chemical vapor deposition, LPCVD) to form the source and drain regions of the p-type FinFET device in the second region 101p. In some embodiments, the epitaxial growth of the epitaxial fin 116p is performed at a temperature of about 400 degrees C. to about 800 degrees C. and under a pressure of about 1 Torr to about 200 Torrs. For example, $SiH_4$ and $GeH_4$ are used as reaction gases.

Embodiments of the disclosure have many variations. In some embodiments, the fin 104p is not recessed to form a recessed fin. In some embodiments, the epitaxial fin 116p is formed on the fin 104p which is not recessed.

Figure 1G:
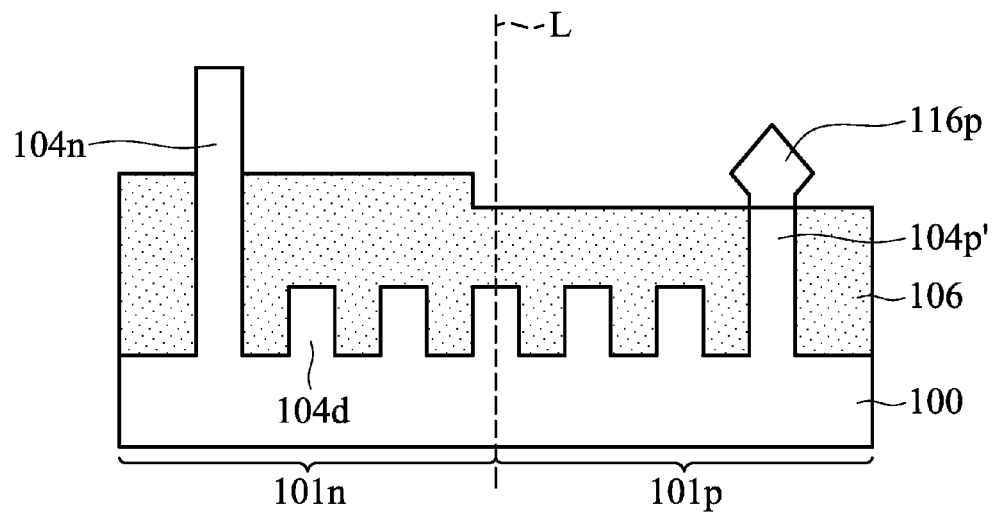

Afterwards, the mask layer 112 is removed, and the fin 104n is exposed, as shown in FIG. 1G in accordance with some embodiments. An etching process may be used to remove the mask layer 112.

Figure 1H:
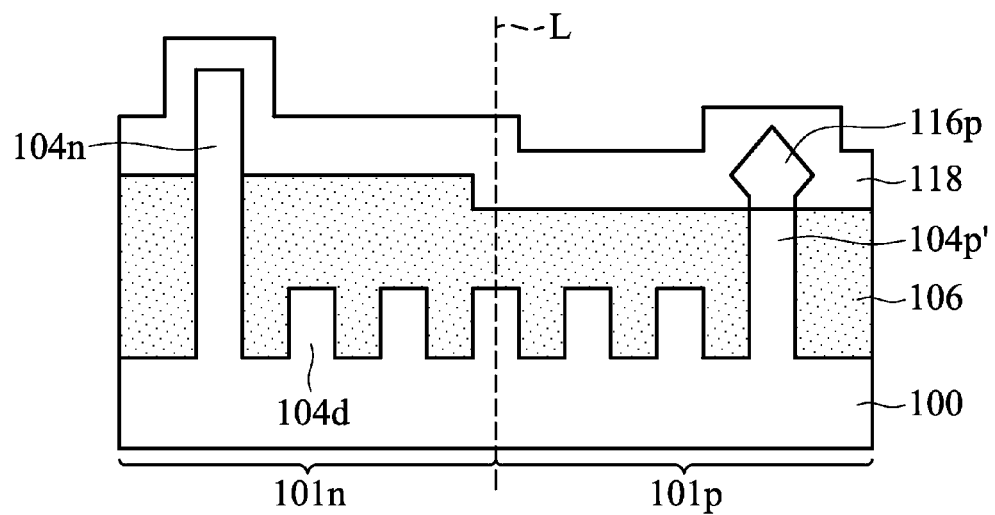

As shown in FIG. 1H, a mask layer 118 is deposited over the fin 104n, the isolation structure 106, and the epitaxial fin 116p, in accordance with some embodiments. In some embodiments, the mask layer 118 is made of silicon nitride, silicon oxynitride, other suitable materials, or a combination thereof. In some embodiments, the mask layer 118 is deposited using a CVD process, a spin-on process, a spraying process, other applicable processes, or a combination thereof.

Figure 1I:
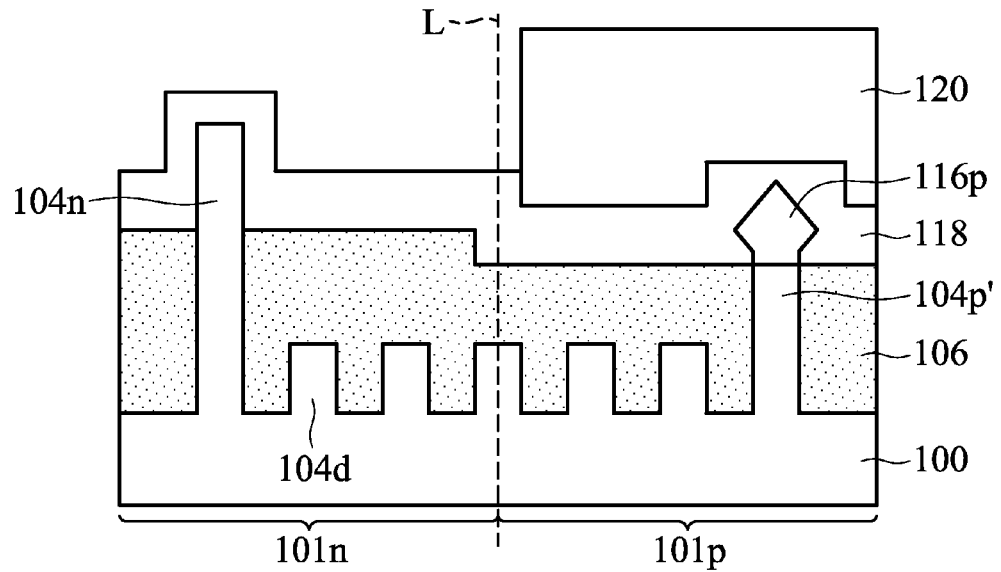

As shown in FIG. 1I, a photosensitive layer 120 is formed over the mask layer 118, in accordance with some embodiments. In some embodiments, the photosensitive layer 120 includes a photoresist layer and is formed using a photolithography process. The photolithography process may include photoresist coating (e.g., spin-on coating), soft baking, mask aligning, exposure, post-exposure baking, developing the photoresist, rinsing, drying (e.g., hard baking), other suitable processes, or a combination thereof. As shown in FIG. 1I, the photosensitive layer 120 covers most portions of the mask layer 118 over the second region 101p. However, a portion of the mask layer 118 near the boundary L between the regions 101n and 101p and over the second region 101p is exposed. The portion of the mask layer 118 over the first region 101n is also exposed without being covered by the photosensitive layer 114.

Figure 1J:
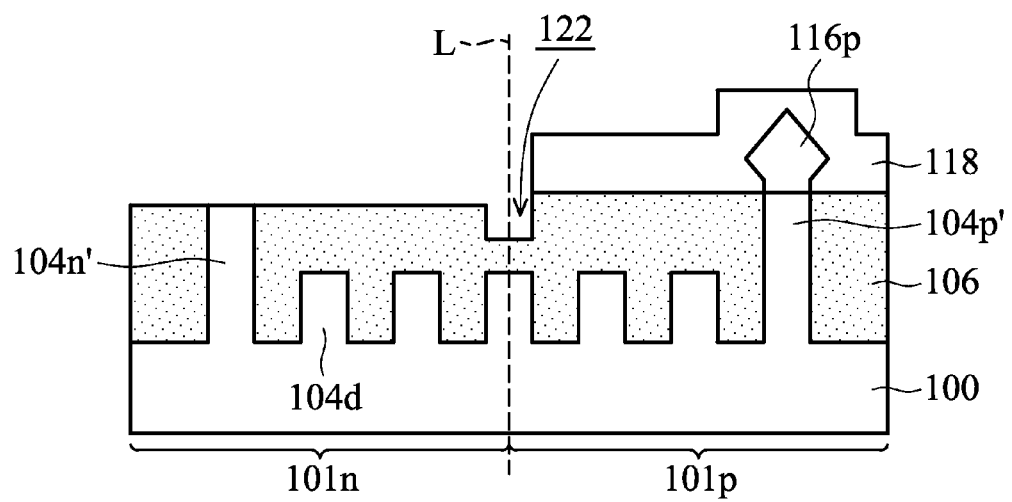

As shown in FIG. 1J, the mask layer 118 not covered by the photosensitive layer 120 is removed, in accordance with some embodiments. Therefore, the pattern of the photosensitive layer 120 is substantially transferred into the mask layer 118. In some embodiments, a portion of the isolation structure 106 is also removed during the same etching process for removal of the mask layer 118 not covered by the photosensitive layer 112. In some embodiments, the fin 104n (see FIG. 1I) is recessed to form a recessed fin 104n' by using an etching process with the mask layer 118 as an etching mask. In some embodiments, top surfaces of the recessed fin 104n' and the isolation structure 106 are substantially coplanar with each other, as shown in FIG. 1J. In some other embodiments, the top surface of the recessed fin 104n' is lower than that of the isolation structure 106. In other words, the fin 104n is etched to form the recessed fin 104n' having a top surface below the top surface of the isolation structure 106. In some embodiments, a portion of the isolation structure 106 is further removed during the etching process for recessing the fin 104n. Embodiments of the disclosure have many variations. In some other embodiments, the fin 104n is not recessed.

As mentioned above, an upper portion of the isolation structure 106 not covered by the mask layer 118 may be removed during the etching processes for removal of the mask layer 118 and recessing the fin. As shown in FIG. 1J, a recess 122 extending from the top surface of the isolation structure 106 is formed, in accordance with some embodiments. The recess 122 is positioned at a region near the boundary L between the regions 101n and 101p. Referring to FIGS. 1D and 1I, it can be found that the recess 122 is positioned at the region substantially not covered by both of the photosensitive layers 114 and 120. Therefore, after the subsequent etching processes, the recess 122 is formed since the region near the boundary L between the regions 101n and 101p are not protected. In some embodiments, the recess 122 extends along the boundary L between the regions 101n and 101p. Afterwards, the photosensitive layer 120 is removed.

Figure 1K:
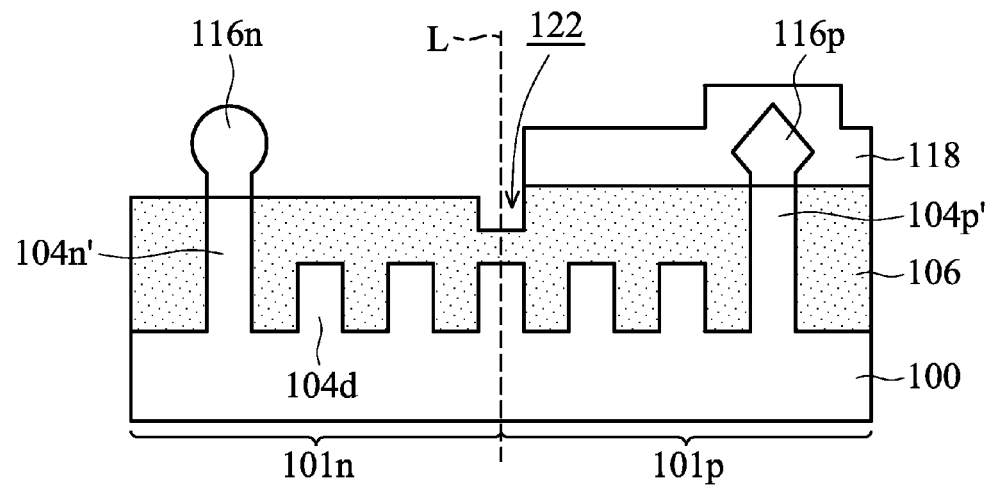

As shown in FIG. 1K, an epitaxial material is selectively grown over the recessed fin 104p' to form an epitaxial fin 116n, in accordance with some embodiments. During the growth of the epitaxial fin 116n, the mask layer 118 prevents the epitaxial material from being grown on the epitaxial fin 116p. In some embodiments, the epitaxial fin 116n is a strained material such as silicon phosphide (SiP), silicon carbide (SiC), and/or other suitable materials. The epitaxial fin 116n is used as strained source and drain regions. Therefore, the channel region under the gate stack 108 is strained or stressed to increase carrier mobility of the device and enhance the device performance. In some embodiments, the surface area of the epitaxial fin 116n is greater than that of the fin 104n. The resistance between the epitaxial fin 116n and a subsequently formed contact may be further reduced.

In some embodiments, the epitaxial fin 116n is epitaxially grown by using a CVD process (such as a low pressure chemical vapor deposition, LPCVD) to form the source and drain regions of the n-type FinFET device in the first region 101n. In some embodiments, the epitaxial growth of the epitaxial fin 116n is performed at a temperature of about 400 degrees C. to about 800 degrees C. and under a pressure of about 1 Torr to about 200 Torrs. For example, $SiH_4$ is mixed with phosphor-containing gas and/or carbon-containing gas to serve as reaction gases.

Embodiments of the disclosure have many variations. In some embodiments, the fin 104n is not recessed to form a recessed fin. In some embodiments, the epitaxial fin 116n is formed on the fin 104n which is not recessed.

In some embodiments, the epitaxial fin 116n is made of a material different from that of the epitaxial fin 116p. In some embodiments, the epitaxial fin 116n and the epitaxial fin 116p are doped with n-type dopants and p-type dopants, respectively. In some embodiments, each of the epitaxial fins 116n and 116p is doped with corresponding suitable dopants during their growth or formation. In some other embodiments, subsequent implantation processes are performed sequentially to dope the epitaxial fins 116n and 116p with suitable dopants, respectively.

Figure 1L:
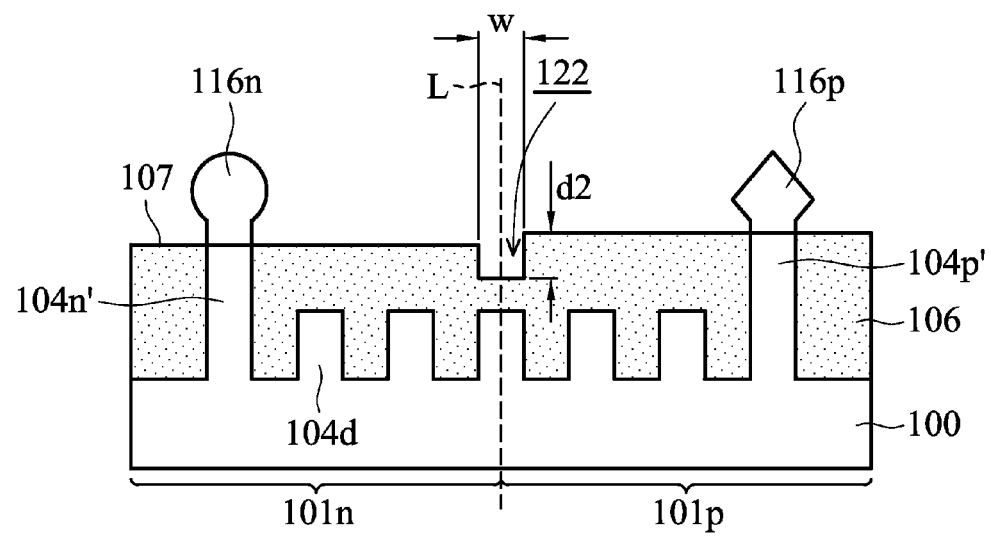

Afterwards, the mask layer 118 is removed, and the epitaxial fin 116p is exposed, as shown in FIG. 1L in accordance with some embodiments. An etching process may be used to remove the mask layer 112. As shown in FIG. 1L, the semiconductor device includes a first fin structure and a second fin structure. In some embodiments, the first fin structure includes a lower portion, such as the recessed fin 104p', and an upper portion, such as the epitaxial fin 116p. Similarly, the second fin structure includes a lower portion, such as the recessed fin 104n', and an upper portion, such as the epitaxial fin 116n. In some embodiments, the upper portions of the first and the second fin structures protrude from a top surface 107 of the isolation structure 106, as shown in FIG. 1L.

In some embodiments, the recess 122 is formed after the epitaxial fin 116p is formed and before the epitaxial fin 116n is formed (see FIG. 1J). As shown in FIG. 1L, the recess 122 extends from the top surface 107 of the isolation structure 106. The recess 122 has a depth d2 and a width w. In some embodiments, the depth d2 is in a range from about 1 nm to about 25 nm. In some embodiments, the width w is in a range from about 20 nm to about 90 nm. In some embodiments, an aspect ratio of the recess 122 is in a range from about 0.05 to about 1.25.

Embodiments of the disclosure have many variations. For example, the epitaxial fin 116n is not limited to being formed before the epitaxial fin 116p. In some other embodiments, the epitaxial fin 116p is formed before the epitaxial fin 116n.

Figure 3A:
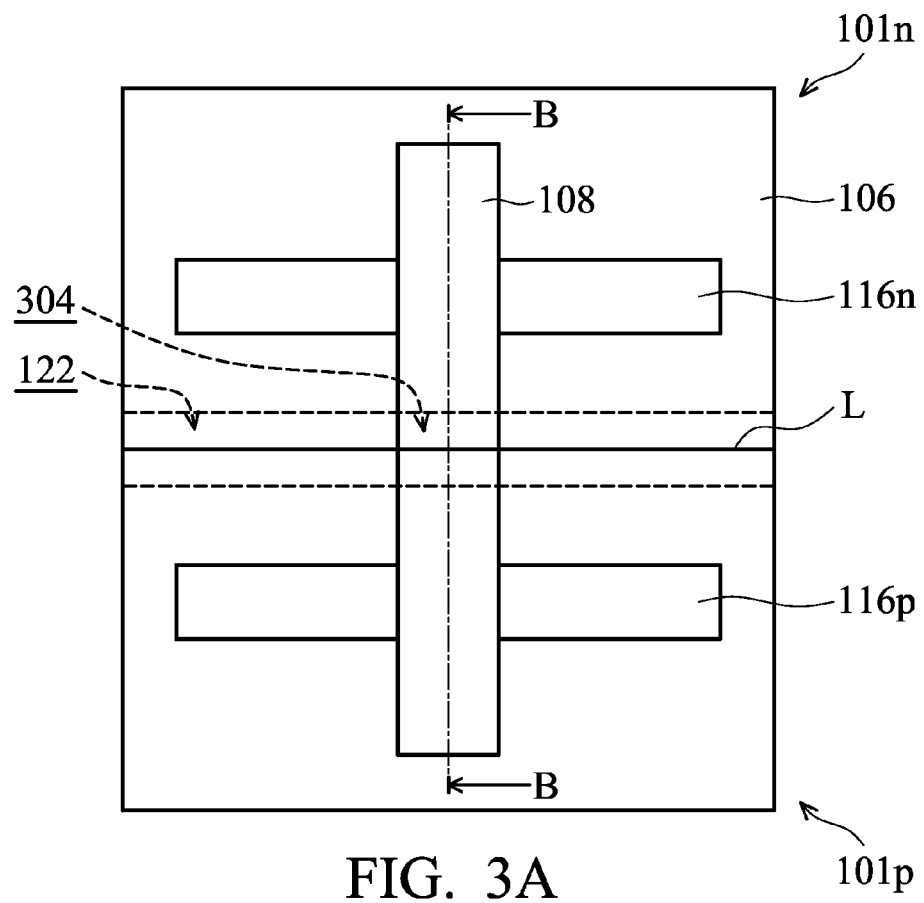
FIG. 3A is a top view of a semiconductor device, in accordance with some embodiments.

FIG. 3A is a top view of a semiconductor device, in accordance with some embodiments. As shown in FIG. 3A, a complementary metal oxide semiconductor fin-like field effect transistor (CMOS FinFET) device is formed. The CMOS FinFET device includes the epitaxial fins 116n and 116p.

Figure 3B:
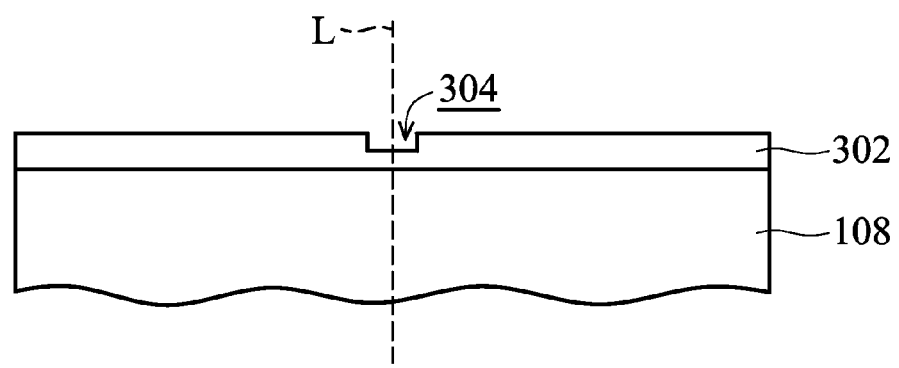
FIG. 3B is a cross-sectional view of a gate stack of a semiconductor device, in accordance with some embodiments.

FIG. 3B is a cross-sectional view of the gate stack 108 taken along the line B-B of FIG. 3A, in accordance with some embodiments. In some embodiments, a hard mask layer 302 is formed over the gate stack 108 to assist in the formation of the gate stack 108. In some embodiments, during the etching processes for removing the mask layers 112 and 118 and for recessing the fin, the hard mask layer 302 over the gate stack 108 is also etched. Similar to the recess 122, the hard mask layer 302 over the boundary L between the regions 101n and 101p is not covered by both of the photosensitive layers 114 and 120. That is, the region of the hard mask layer 302 near the boundary L between the regions 101n and 101p are also not protected. As a result, the thickness of the hard mask layer 302 is reduced, and a recess 304, similar to the recess 122, is formed. In some embodiments, the patterns of the photosensitive layers 114 and 120 are designed to be partially overlapped. As a result, the recesses 304 and 122 are formed. In some embodiments, the recess 304 is formed simultaneously with the formation of the recess 122.

As shown in FIGS. 3B and 3A, the recess 304 extends along the boundary L between the regions 101n and 101p. In some embodiments, the recesses 304 and 122 are substantially aligned with each other, in accordance with some embodiments. In some embodiments, extending directions of the recesses 304 and 122 are substantially parallel with each other. In some embodiments, extending directions of the recesses 122 and 304 are substantially parallel with those of the epitaxial fins 116n and 116p.

In some embodiments, the hard mask layer 302 over the gate stack 108 is removed to facilitate subsequent processes. For example, the subsequent processes include a gate replacement process. In some embodiments, the hard mask layer 302 is removed to expose the gate electrode which is made of, for example, polysilicon. Afterwards, the gate electrode is removed, and a metal gate electrode is formed to replace the original gate electrode. The metal gate electrode may include a work function layer and a metal filling layer.

The work function layer is configured to provide a desired work function for transistors to enhance device performance including improved threshold voltage. In the embodiments of forming an n-type FinFET, the work function layer can be an n-type metal capable of providing a work function value suitable for the device, such as equal to or less than about 4.5 eV. The n-type metal may include metal, metal carbide, metal nitride, or a combination thereof. For example, the n-type metal includes tantalum, tantalum nitride, or a combination thereof. On the other hand, in the embodiments of forming a p-type FinFET, the work function layer can be a p-type metal capable of providing a work function value suitable for the device, such as equal to or greater than about 4.8 eV. The p-type metal may include metal, metal carbide, metal nitride, other suitable materials, or a combination thereof. For example, the p-type metal includes titanium, titanium nitride, other suitable materials, or a combination thereof. In some embodiments, the metal filling layer is made of aluminum, tungsten, gold, platinum, cobalt, other suitable metals, or a combination thereof.

Because the patterns of the photosensitive layers 114 and 120 are partially overlapped, the region near the boundary L between the regions 101n and 101p are etched to from the recess 304. In some other cases, if the patterns of the photosensitive layers 114 and 120 are not overlapped, the hard mask layer 302 may have a protruding portion near the boundary L between the regions 101n and 101p. As a result, it is relatively difficult to remove the hard mask layer 302. Additional etching operations and/or planarization operations may be needed to be performed for removal of the protruding portion of the hard mask layer 302. The fabrication cost and fabrication time would thus be increased. The additional etching operations and/or planarization operations may damage the elements of the semiconductor device.

Figure 4A:
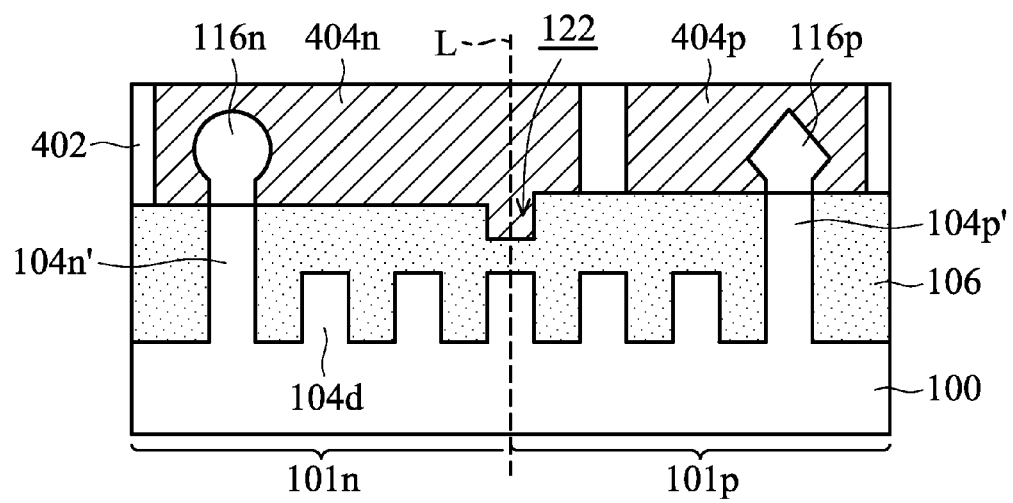
FIGS. 4A-4C are cross-sectional views of a gate stack of a semiconductor device, in accordance with some embodiments.
Figure 4B:
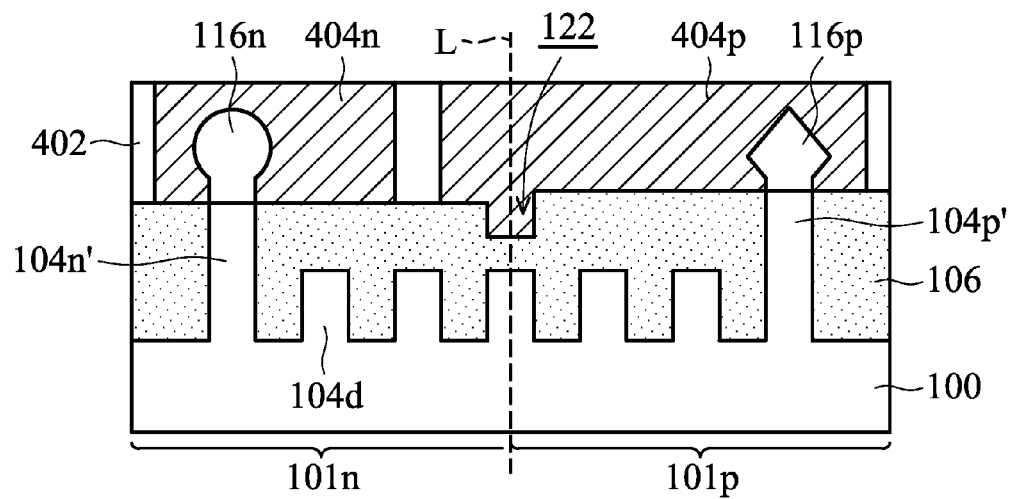
Figure 4C:
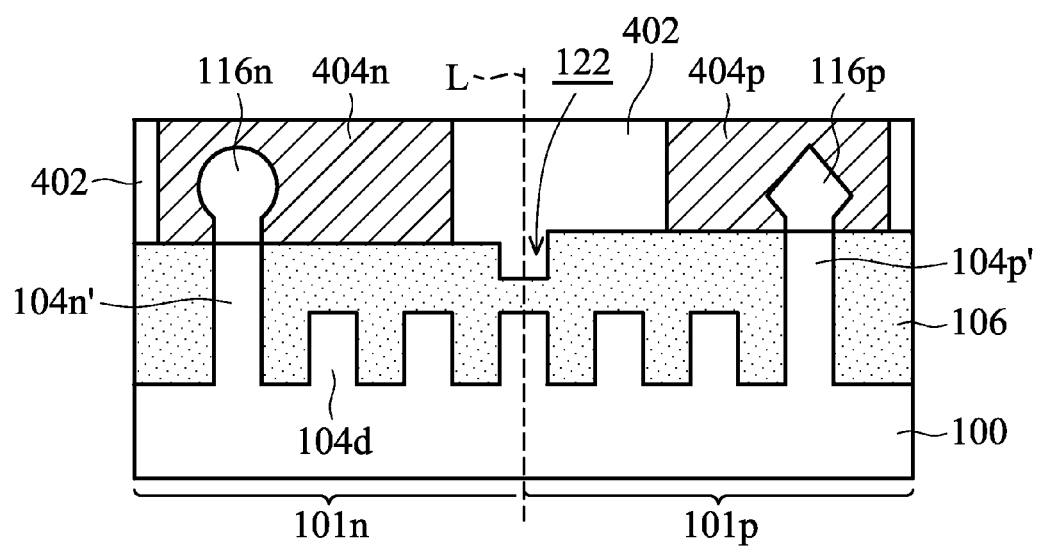

FIGS. 4A-4C are cross-sectional views of a gate stack of a semiconductor device, in accordance with some embodiments. As shown in FIG. 4A, contacts 404n and 404p are formed over the semiconductor substrate 100 to electrically connect to the epitaxial fins 116n and 116p, respectively. The contacts 404n and 404p serve as source/drain contacts of the semiconductor device.

In some embodiments, a dielectric layer 402 is formed over the isolation structure 106 and the epitaxial fins 116n and 116p. In some embodiments, the dielectric layer 402 is made of silicon oxide, silicon oxynitride, borosilicate glass (BSG), phosphoric silicate glass (PSG), borophosphosilicate glass (BPSG), fluorinated silicate glass (FSG), low-k material, porous dielectric material, other suitable materials, or a combination thereof. In some embodiments, the dielectric layer 402 is deposited using a CVD process, a spin-on process, a PVD process, other applicable processes, or a combination thereof. Afterwards, the dielectric layer 402 is patterned to form openings exposing the epitaxial fins 116n and 116p. In some embodiments, a photolithography process and an etching process are used to pattern the dielectric layer 402. In some embodiments, a planarization process is performed to provide the dielectric layer 402 with a substantially planar surface before patterning the dielectric layer 402. The planarization process may include a CMP process. In some embodiments, an etch stop layer (not shown) is deposited before the dielectric layer 402. The etch stop layer includes, for example, silicon nitride, silicon oxynitride, or other suitable materials.

In some embodiments, a conductive layer is deposited over the dielectric layer 402 and the epitaxial fins 116n and 116p. Afterwards, the conductive layer is patterned to form the contacts 404n and 404p. In some embodiments, the conductive layer includes copper, tungsten, aluminum, nickel, titanium, platinum, other suitable conductive materials, or a combination thereof. In some embodiments, the conductive layer is deposited using a PVD process, an electroplating process, a CVD process, other applicable processes, or a combination thereof. In some embodiments, a planarization process, such as a CMP process, is performed to remove the deposited conductive layer outside of the openings of the dielectric layer 402. As a result, the contacts 404n and 404p surrounded by the dielectric layer 402 are formed.

Embodiments of the disclosure have many variations. In some embodiments, before the contacts 404n and 404p are formed, metal silicide regions (not shown) are formed on the epitaxial fins 116n and 116p, respectively. Therefore, resistance between the contacts and the epitaxial fins may be further reduced.

As shown in FIG. 4A, the contact 404n fills the recess 122, in accordance with some embodiments. In some embodiments, the contact 404n is in electrical contact with the source/drain region of an n-type epitaxial fin (the epitaxial fin 116n), and the contact 404p is in electrical contact with the source/drain region of a p-type epitaxial fin (the epitaxial fin 116p).

Embodiments of the disclosure have many variations. As shown in FIG. 4B, the contact 404p fills the recess 122, in accordance with some embodiments. In some other embodiments, both of the contacts 404n and 404p do not fill the recess 122. As shown in FIG. 4C, the dielectric layer 402 fills the recess 122.

The disclosure provides embodiments relating to structures and formation methods of a CMOS FinFET device. Patterned mask layers are used to assist in the formation of n-type epitaxial fins and p-type epitaxial fins. The patterns of the patterned mask layers are partially overlapped. As a result, a recess is formed between the n-type and p-type epitaxial fins, and another recess is formed on a hard mask layer over a gate stack of the CMOS FinFET device after multiple etching processes. Due to the recess on the hard mask layer, a subsequent removal process of the hard mask layer becomes easier. Fabrication cost and time are therefore reduced. Device performance is improved.

In accordance with some embodiments, a semiconductor device is provided. The semiconductor device includes a semiconductor substrate and an isolation structure over the semiconductor substrate. The semiconductor device also includes a first epitaxial fin and a second epitaxial fin over the semiconductor substrate, and the first epitaxial fin and the second epitaxial fin protrude from the isolation structure. The semiconductor device further includes a gate stack over and traversing the first epitaxial fin and the second epitaxial fin. In addition, the semiconductor device includes a recess extending from a top surface of the isolation structure. The recess is between the first epitaxial fin and the second epitaxial fin.

In accordance with some embodiments, a semiconductor device is provided. The semiconductor device includes a semiconductor substrate and an isolation structure over the semiconductor substrate. The semiconductor device also includes an n-type epitaxial fin and a p-type epitaxial fin over the semiconductor substrate. The n-type epitaxial fin and the p-type epitaxial fin protrude from the isolation structure. The semiconductor device further includes a gate stack over and traversing the n-type epitaxial fin and the p-type epitaxial fin. In addition, the semiconductor device includes a recess extending from a top surface of the isolation structure. The recess is between the n-type epitaxial fin and the p-type epitaxial fin.

In accordance with some embodiments, a method for forming a semiconductor device is provided. The method includes forming a first fin and a second fin over a semiconductor substrate. The method also includes forming an isolation structure over the semiconductor substrate to surround lower portions of the first fin and the second fin. The method further includes forming a gate stack over the first fin and the second fin, and the gate stack traverses the first fin and the second fin. In addition, the method includes sequentially forming a first epitaxial fin and a second epitaxial fin over the first fin and the second fin, respectively. A recess is formed in the isolation structure after the first epitaxial fin is formed and before the second epitaxial fin is formed. The recess is between the first epitaxial fin and the second epitaxial fin.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a semiconductor substrate;
   an isolation structure over the semiconductor substrate;
   a first epitaxial fin and a second epitaxial fin over the semiconductor substrate, wherein the first epitaxial fin and the second epitaxial fin protrude from the isolation structure;
   a gate stack over and traversing the first epitaxial fin and the second epitaxial fin; and
   a recess extending from a top surface of the isolation structure, wherein the recess is between the first epitaxial fin and the second epitaxial fin.

2. The semiconductor device as claimed in claim 1, wherein the gate stack comprises a metal material.

3. The semiconductor device as claimed in claim 1, wherein materials of the first epitaxial fin and the second epitaxial fin are different from each other.

4. The semiconductor device as claimed in claim 1, wherein the second epitaxial fin comprises silicon phosphide, silicon carbide, or a combination thereof.

5. The semiconductor device as claimed in claim 1, wherein the first epitaxial fin comprises silicon germanium.

6. The semiconductor device as claimed in claim 1, wherein an extending direction of the recess is substantially parallel to those of the first epitaxial fin and the second epitaxial fin.

7. The semiconductor device as claimed in claim 1, further comprising:
   a first contact over the semiconductor substrate and electrically connected to the first epitaxial fin;
   a second contact over the semiconductor substrate and electrically connected to the second epitaxial fin; and
   a dielectric layer over the semiconductor substrate and surrounding the first contact and the second contact.

8. The semiconductor device as claimed in claim 7, wherein the first contact fills the recess, and the first epitaxial fin comprises a p-type epitaxial fin.

9. The semiconductor device as claimed in claim 7, wherein the second contact fills the recess, and the second epitaxial fin comprises an n-type epitaxial fin.

10. The semiconductor device as claimed in claim 7, wherein the dielectric layer fills the recess.

11. A semiconductor device, comprising:
    a semiconductor substrate;
    an isolation structure over the semiconductor substrate;
    an n-type epitaxial fin and a p-type epitaxial fin over the semiconductor substrate, wherein the n-type epitaxial fin and the p-type epitaxial fin protrude from the isolation structure;
    a gate stack over and traversing the n-type epitaxial fin and the p-type epitaxial fin; and
    a recess extending from a top surface of the isolation structure, wherein the recess is between the n-type epitaxial fin and the p-type epitaxial fin.

12. The semiconductor device as claimed in claim 11, wherein the gate stack comprises a metal material.

13. The semiconductor device as claimed in claim 11, wherein an extending direction of the recess is substantially parallel to those of the n-type epitaxial fin and the p-type epitaxial fin.

14. The semiconductor device as claimed in claim 11, further comprising:
- a first contact over the semiconductor substrate and electrically connected to the p-type epitaxial fin;
- a second contact over the semiconductor substrate and electrically connected to the n-type epitaxial fin; and
- a dielectric layer over the semiconductor substrate and surrounding the first contact and the second contact.

15. The semiconductor device as claimed in claim 14, wherein one of the first contact and the second contact fills the recess.

16. A method for forming a semiconductor device, comprising:
- forming a first fin and a second fin over a semiconductor substrate;
- forming an isolation structure over the semiconductor substrate to surround lower portions of the first fin and the second fin;
- forming a gate stack over the first fin and the second fin, wherein the gate stack traverses the first fin and the second fin; and
- sequentially forming a first epitaxial fin and a second epitaxial fin over the first fin and the second fin, respectively, wherein a recess is formed in the isolation structure after the first epitaxial fin is formed and before the second epitaxial fin is formed, and the recess is between the first epitaxial fin and the second epitaxial fin.

17. The method for forming a semiconductor device as claimed in claim 16, wherein the step of sequentially forming the first epitaxial fin and the second epitaxial fin comprises:
- forming a first mask layer over the second fin;
- forming the first epitaxial fin over the first fin after the first mask layer is formed;
- removing the first mask layer;
- forming a second mask layer over the first epitaxial fin;
- forming the second epitaxial fin over the second fin after the second mask layer is formed; and
- removing the second mask layer.

18. The method for forming a semiconductor device as claimed in claim 17, further comprising:
- recessing the first fin before the first epitaxial fin is formed; and
- recessing the second fin before the second epitaxial fin is formed.

19. The method for forming a semiconductor device as claimed in claim 18, wherein the recess is formed after the second fin is recessed and before the second epitaxial fin is formed.

20. The method for forming a semiconductor device as claimed in claim 16, further comprising forming a hard mask layer over the gate stack, wherein a second recess is formed in the hard mask layer simultaneously with the formation of the recess, and the second recess is substantially aligned with the recess.

* * * * *